(12) United States Patent
Chuang

(10) Patent No.: US 6,768,436 B1
(45) Date of Patent: Jul. 27, 2004

(54) METHOD AND CIRCUIT RESETTING DELTA SIGMA MODULATOR

(75) Inventor: Shang-Yuan Chuang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/419,431

(22) Filed: Apr. 21, 2003

(51) Int. Cl.[7] .............................................. H03M 3/00
(52) U.S. Cl. ...................................... 341/143; 341/144
(58) Field of Search ................................ 341/143, 144, 341/145, 155, 200, 118, 120, 150

(56) References Cited

U.S. PATENT DOCUMENTS

| | | | |
|---|---|---|---|
| 5,012,244 A | 4/1991 | Wellard et al. | 341/143 |
| 5,977,895 A | 11/1999 | Murota et al. | 341/143 |
| 6,064,326 A | 5/2000 | Krone et al. | 341/143 |
| 6,362,763 B1 | 3/2002 | Wang | 341/143 |
| 6,489,907 B2 * | 12/2002 | Cusinato et al. | 341/143 |
| 6,522,277 B2 * | 2/2003 | Fujimori et al. | 341/144 |

* cited by examiner

Primary Examiner—Brian Young
Assistant Examiner—Joseph Lauture
(74) Attorney, Agent, or Firm—W. Daniel Swayze, Jr.; W. James Brady; Frederick J. Telecky, Jr.

(57) ABSTRACT

A delta sigma modulator circuit sums an input signal with a feedback signal representing signal conditions in a group of integrators to provide an input to a quantizer and monitors a signal at the quantizer output to produce a restore signal (RESETA) indicating an instability condition. An integrator includes a dual purpose switch (S3) that is operated together with first and second sampling switches to accomplish an input signal sampling operation and also is operated together with first and second charge transfer switches and an output reset switch to accomplish precise resetting of the integrator, without being directly connected to the amplifier inputs. The dual purpose switch and the reset switch are controlled, respectively, by performing a logical ORing of a first clock signal and the restore signal (RESETA) and by performing a logical ANDing of a non-overlapping second clock signal and the restore signal (RESETA).

21 Claims, 7 Drawing Sheets

DURING Φ1 OF RESET OPERATION:

DURING Φ2 OF RESET OPERATION:

METHOD AND CIRCUIT RESETTING DELTA SIGMA MODULATOR

BACKGROUND OF THE INVENTION

The present invention relates generally to improvements in delta-sigma modulator analog-to-digital converters, and particularly, to improvements in integrator circuits for delta-sigma analog-to-digital converters.

Various techniques of providing analog-to-digital conversion of signals are well known. One well-known oversampling analog-to-digital (A/D) conversion technique uses a delta-sigma modulator including one or more integrators, a comparator, and a digital-to-analog converter (DAC) in the feedback path. A low-pass decimation filter is used allowing the modulator to provide necessary filtering. Typically, it is desirable in the design of a delta-sigma modulator to reduce quantization noise, which may be achieved by providing a transfer function for the overall modulator that possesses high in-band gain and high out-of-band attenuation, thereby shaping the quantization noise spectrum advantageously. This is usually accomplished by use of higher order delta signal modulators, which include multiple integration stages. Higher order modulators become unstable and therefore oscillate for inputs that exceed certain bounds. Instability may also occur as a result of the modulator being powered up since, since powering up of operational amplifier integrators with arbitrary initial states may place the modulator in an unstable region of its state space. Therefore, higher order delta sigma modulators require circuitry for detecting instability and restoring or resetting the modulator loop back to a stable state.

One approach to correcting the instability found in higher order modulators (three or more integration stages) is to use state-variable clamping techniques. FIG. 2 shows an integration stage 18 of a modulator including an operational amplifier 20 having an integration capacitor 22 and a limiter 24 coupled between the non-inverting input and the output of the operational amplifier 20. A non-linear element, such as a limiter, coupled across the integrating capacitor 22 prevents large values from appearing at the integrator output. Typically, for a higher order modulator circuit, the non-linear elements are set to turn "ON" at voltage levels of about 20–50% higher than the peak-to-peak integrator voltage swings. Examples of limiting schemes implemented in an integrator stage are shown in U.S. Pat. No. 5,977,895 by Murota et al., issued Nov. 2, 1999, entitled "WAVEFORM SHAPING CIRCUIT FOR FUNCTION CIRCUIT AND HIGH ORDER DELTA SIGMA MODULATOR", U.S. Pat. No. 6,064,326 by Krone et al., issued May 16, 2000, entitled "ANALOG-TO-DIGITAL CONVERSION OVERLOAD DETECTION AND SUPPRESSION", and U.S. Pat. No. 5,012,244 by Wellard et al., issued Apr. 30, 1991, entitled "DELTA-SIGMA MODULATOR WITH OSCILLATION DETECT AND RESET CIRCUIT" disclose known ways of detecting instability of a delta sigma modulator and restoring it to a stable state.

However, the closest prior art to the present invention is believed to be commonly assigned U.S. Pat. No. 6,362,763 by Wang, entitled METHOD AND APPARATUS FOR OSCILLATION RECOVERY IN A DELTA-SIGMA AID CONVERTER, issued Mar. 26, 2002.

FIGS. 1 and 2 herein indicate the circuit structure of the integrators included in the delta sigma modulator of the '763 patent.

A problem with the delta sigma modulator shown in U.S. Pat. No. 6,362,763 is that its circuit topology is likely to result in unbalanced parasitic capacitances which produce errors due to the additional switch 70 that is coupled between the input notes of the differential amplifier 64. These parasitic-capacitance-errors are amplified by amplifier 64 and can substantially reduce the accuracy of the delta sigma modulator. Also, in some implementations, the switch 70 must be located a long distance on the semiconductor chip from the switch 72, which may necessitate use of different reset signals to control the two switches to ensure that they are simultaneously turned on and off to avoid errors at the sensitive (+) and (−) inputs of the amplifier 64.

Thus, there is an unmet need for an improved, inexpensive, stable delta sigma ADC of order greater than 1 that is more accurate than the one shown in a U.S. Pat. No. 6,362,763.

There also is an unmet need for a stable, more accurate delta sigma modulator in a delta sigma ADC of order greater than 1 which requires less chip area than the one shown in U.S. Pat. No. 6,362,763.

There also is an unmet need to avoid inaccuracy caused by unbalanced parasitic devices in the integrators of a delta sigma ADC of order greater than 1.

There also is an unmet need for a delta sigma modulator of order greater than 1 which avoids the need to generate an additional reset signal to prevent a delay between turn-off times of two integrator reset switches which are separated by a large distance on an integrated circuit chip.

SUMMARY OF THE INVENTION

It is an object of the present invention to provide an improved, stable, inexpensive delta sigma ADC of order greater than 1 that is more accurate than the one shown in a U.S. Pat. No. 6,362,763.

It is another object of the present invention to provide an improved, stable, inexpensive delta sigma ADC of order greater than 1 which requires less chip area than the one shown in U.S. Pat. No. 6,362,763.

It is another object of the present invention to provide a stable delta sigma modulator in a delta sigma ADC of order greater than 1 which avoids inaccuracy caused by unbalanced parasitic devices in the integrators of a delta sigma ADC of order greater than 1.

It is another object of the present invention to provide an improved delta sigma ADC of order greater than 1 which avoids the need to generate an additional reset signal to prevent a delay between turn-off times of two integrator reset switches which are separated by a large distance on an integrated circuit chip.

Briefly described, and in accordance with one embodiment thereof, the invention provide a delta sigma modulator circuit including circuitry for summing an input signal with a feedback signal representing signal conditions in a group of integrators to provide an input to a quantizer, circuitry for monitoring a signal at the quantizer output to produce a restore signal (RESETA) indicating an instability condition, and an integrator including a dual purpose switch (S3) that is operated together with first and second sampling switches to accomplish an input signal sampling operation and also is operated together with first and second charge transfer switches and an output reset switch to accomplish precise resetting of the integrator without being directly connected to the amplifier inputs.

In a described embodiment, a delta sigma modulator circuit that sums an analog input signal and a feedback signal to provide an input signal to a plurality of integrators (92, 94, 96) coupled sequentially between an output of a summing device and an input of a quantizer produces the feedback signal as an analog feedback signal representative of signal conditions in one or more of the integrators and monitors a signal at an output (88) of the quantizer and produces a restore signal (RESETA or RESET) in response to occurrence of an instability condition that is caused by a positive input overvoltage of the analog input signal (86) and is represented by the signal at the quantizer output (88). One or more of the integrators each includes first and second input terminals and first and second output terminals, first (S1A) and second (S1B) sampling switches, a first switch (S2C), first (C1) and second (C2) sampling capacitors, a second switch (S3), first (S2A) and second (S2B) charge transfer switches, an operational amplifier (64), first (66) and second (68) integrating capacitors, and a reset switch (S4). A first terminal of the first sampling switch (S1A) is coupled to the first input terminal and a first terminal of the second sampling switch (S1B) being coupled to the second input terminal. The second terminal of the first input sampling switch (S1A) is coupled to a first terminal of the first switch (S2C) and a first terminal of the first sampling capacitor (C1), a second terminal of the second input sampling switch (S1B) being coupled to a second terminal of the first switch (S2C) and a first terminal of the second sampling capacitor (C2). A second terminal of the first sampling capacitor (C1) is coupled to a first terminal of the second switch (S3) and a first terminal of the first charge transfer switch (S2A), a second terminal of the second sampling capacitor (C2) being coupled to a second terminal of the second switch (S3) and a first terminal of the second charge transfer switch (S2B). A second terminal of the first charge transfer switch (S2A) is coupled to a (+) input of the operational amplifier and a first terminal of the first integrating capacitor (66), a second terminal of the second charge transfer switch (S2B) being coupled to a (−) input of the operational amplifier and a first terminal of the second integrating capacitor (68). A second terminal of the first integrating capacitor (66) is coupled to a (−) output of the operational amplifier and a first terminal of the reset switch (S4), a second terminal of the second integrating capacitor (68) being coupled to a (+) output of the operational amplifier and a second terminal of the reset switch (S4). The first (S1A) and second (S1B) sampling switches are controlled by a first clock signal ($\phi1$), the first switch (S2C) and the first and second charge transfer switches are controlled by a second clock signal ($\phi2$), and the second switch (S3) is controlled by a derived clock signal (P1). The derived clock signal (P1) is generated in response to the first and second clock signals and the restore signal (RESETA). The reset switch is controlled by a reset signal (RESET) which is produced in response to the first and second clock signals and the restore signal (RESETA).

The derived clock signal (P1) is produced by performing a logical ORing function on the first clock signal, and the restore signal (RESETA) is produced by performing a logical ANDing function on the signal and the restore signal (RESETA), wherein the second switch (S3) and the reset switch (S4) are turned on or off precisely in response to corresponding changes in logical levels of the restore signal (RESETA).

DETAILED DESCRIPTION OF THE PREFERRED EMBODIMENTS

Figure 3:
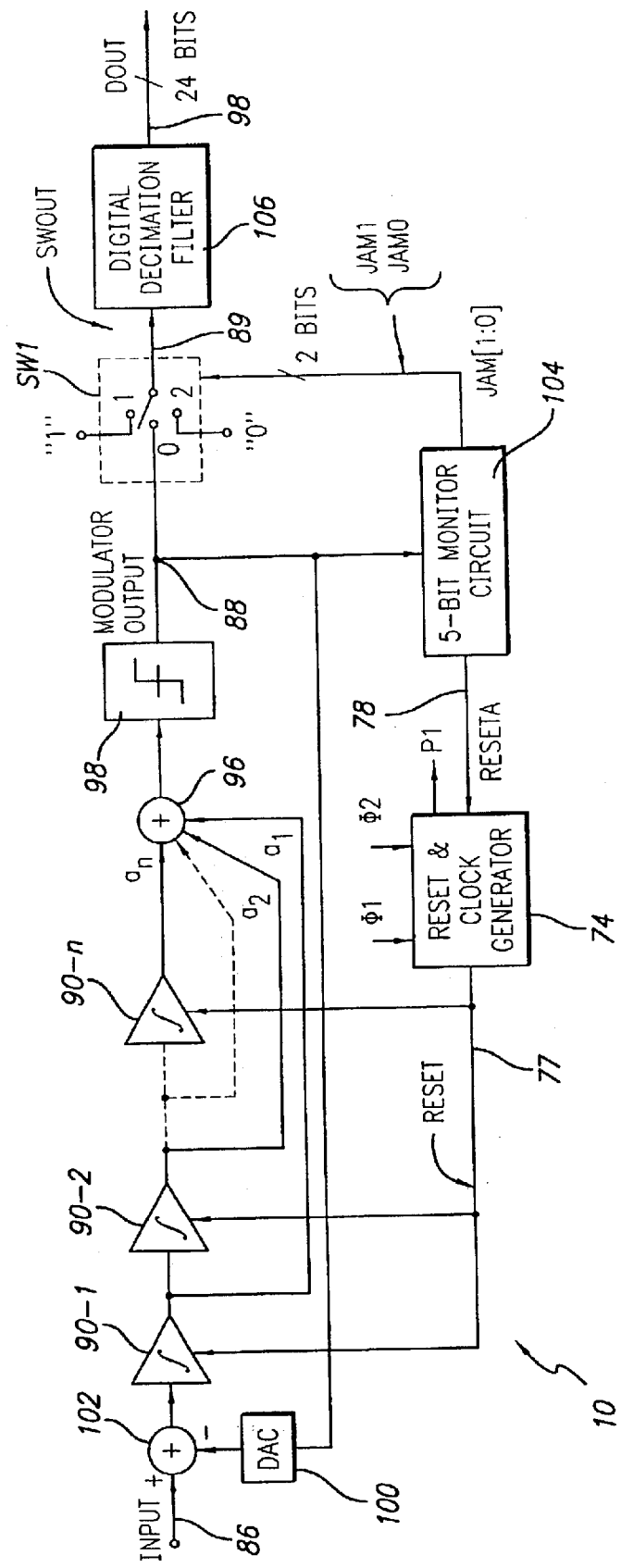
FIG. 3 is a block diagram of a delta sigma ADC of present invention.

Referring to FIG. 3, a delta-sigma ADC 10 includes a high order delta sigma modulator which includes an input conductor 86 conducting an analog input signal INPUT to the (+) input of an analog summer 102, a plurality of n successively coupled or cascaded integrator stages including integrator stages 90-1, 2 . . . n, a quantizer 98, n feedforward conductors a1, a2, . . . $a_n$, and an output conductor 88 conducting the modulator output signal MODULATOR OUTPUT. The output of the first integrator 90-1 is coupled to the input of integrator 90-2, the output of which is coupled to the input of the next integrator, and so forth. The feedforward conductors $a_1$, $a_2$ and $a_n$ are coupled to the outputs of each integrator stage 90-1, 2 . . . n, respectively. The feedforward conductors $a_1$, $a_2$ and $a_n$ couple outputs of the respective integrator stages forward to corresponding inputs of an analog summer 96, the output of which is coupled to the input of a first summer or summing junction 96, the output of which is coupled to the input of a quantizer 98. (Quantizer 98 can be any device that generates a digital output in response to an analog input, such as, but not limited to, a comparator, a 1-bit A/D converter, or the like.)

The digital output of quantizer 98 is coupled to modulator output conductor 88. The modulator output conductor 88 is coupled to an input of a monitor circuit 104, which can be the same as the one shown in FIG. 9 of above-mentioned U.S. Pat. No. 6,362,763, which is incorporated herein by reference. In the embodiment shown, monitor circuit 104 "monitors" a signal MODULATOR OUTPUT on conductor 88 to detect the occurrence of any sequence of 24 consecutive "1"s and any sequence of 24 consecutive "0"s thereon. The output of monitor circuit 104 is coupled by a conductor 78 to an input of a reset and clock signal generator circuit 74 which generates an output signal RESET on conductor 77. Conductor 77 is connected to a reset input of each of the integrator stages 90-1, 2 . . . n to reset them if an unstable or potentially unstable condition (which in this case is represented by a sequence of 24 consecutive "1"s or 24 consecutive "0"s of MODULATOR OUTPUT), is detected. Thus, monitor circuit 104, which can be easily implemented as a state machine, functions as a detect and restore circuit that operates to monitor the characteristics of the modulator output signal to determine if the delta sigma modulator is operating at or near what is considered to be an unstable condition. Whenever it is determined that the delta sigma modulator is at or near an unstable condition, monitor circuit 104 generates a restore signal RESETA on conductor 78, which causes reset and clock generator circuit 74 to apply a reset signal RESET to the restore inputs of at least some of integrators 90-1, 2 . . . n to selectively restore them to a stable condition.

Modulator output conductor 88 also is fed back to the digital input of a DAC 100, the output of which is coupled to the (−) input of analog summer 102. The output of analog summer 102 is coupled to the input of the first integrator stage 90-1. Modulator output conductor 88 also is connected to the input of a decimation filter 106, which is a conventional digital filter that can be easily implemented by those skilled in the art. The output of decimation filter 106 is the digital output DOUT of delta sigma ADC 10.

Figure 5:
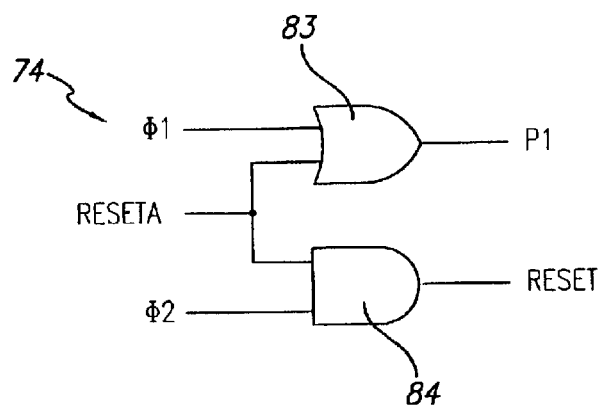
FIG. 5 is a logical diagram for a circuit generating the signals P1 and RESET used in FIG. 3.

Referring next to FIG. 5, reset and clock generator circuit 74 includes OR gate 83 and AND gate 84. Clock signal φ1 is coupled to one input of OR gate 83, the output of which produces switch control signal P1. The restore signal RESETA produced by monitor circuit 104 is coupled to the other input of OR gate 83 and AND gate 84. Clock signal φ2 is coupled to the other input of AND gate 84, the output of which produces RESET. Reset and clock generator circuit 74 can be utilized to produce the subsequently described switch control signal P1 and the signal RESET in response to the two clock signals φ1 and φ2 and the output RESETA produced by monitor circuit 104. The five signals shown in FIG. 5 are used to operate the integrators of the delta sigma modulator portion of delta sigma ADC 10, as subsequently explained with reference to FIGS. 4A–E. (The logic circuit shown in FIG. 5 could also be implemented in various other ways.)

Figure 4A:
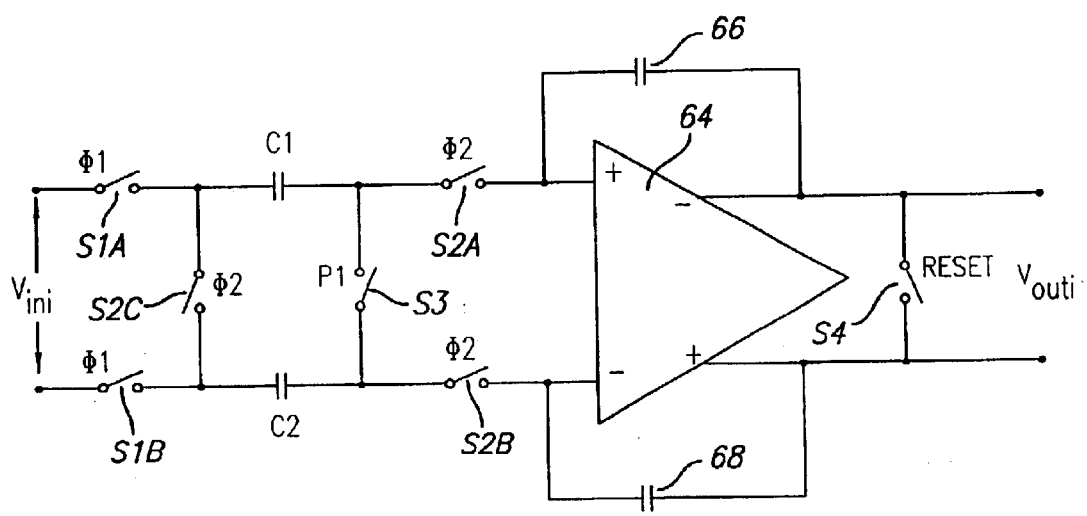
FIG. 4A is a schematic diagram of an integrator of the present invention as shown in FIG. 3.

A preferred implementation of each of the integrators 90-1, 2 . . . n in delta sigma ADC 10 is shown in FIG. 4A. An analog input signal VINi produced by either analog summer 102 or a preceding integrator is applied between a first terminal of a first sampling switch S1A and a second input terminal connected to one terminal of a second sampling switch S1B. The second terminal of sampling switch S1A is connected to one terminal of a switch S2C and also to a first terminal of a first sampling capacitor C1. The second terminal of sampling switch S1B is connected to the other terminal of switch S2C and a first terminal of a second sampling capacitor C2. A second terminal of sampling capacitor C1 is connected to a first terminal of a switch S3 and also to one terminal of a first charge transfer switch S2A. A second terminal of sampling capacitor C2 is connected to the second terminal of switch S3 and to one terminal of a second charge transfer switch S2B. The second terminal of charge transfer switch S2A is connected to the (+) input of an operational amplifier 64 and to a first terminal of a first integrating capacitor 66. The second terminal of transfer switch S2B is connected to the (−) input of operational amplifier 64 and to one terminal of a second integrating capacitor 68. The second terminal of integrating capacitor 66 is connected to a (−) output of operational amplifier 64 and to one terminal of a reset switch S4, the other terminal of which is connected to a (+) output of operational amplifier 64 and to a second terminal of integrating capacitor 68. An integrator output voltage VOUTi is produced between the (−) and (+) outputs of amplifier 64. Sampling switches S1A and S1B are controlled by φ1, switches S2A, S2B and S2C are controlled by φ2, switch S3 is controlled by P1, and switch S4 is controlled by RESET.

Figure 4B:
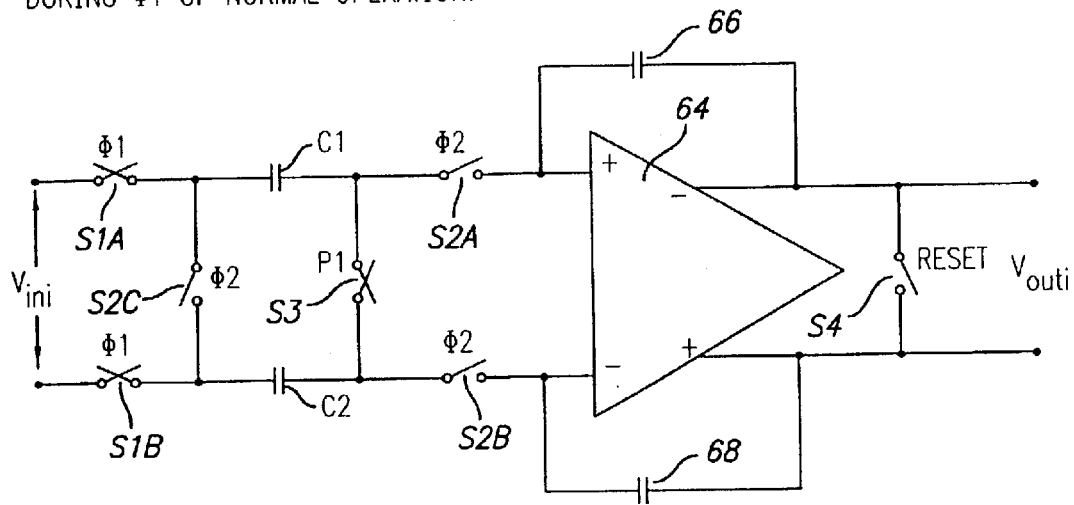
FIG. 4B is a schematic diagram showing the state of the integrator of FIG. 4A during $\phi1$ of normal analog-to-digital conversion operation.
Figure 4C:
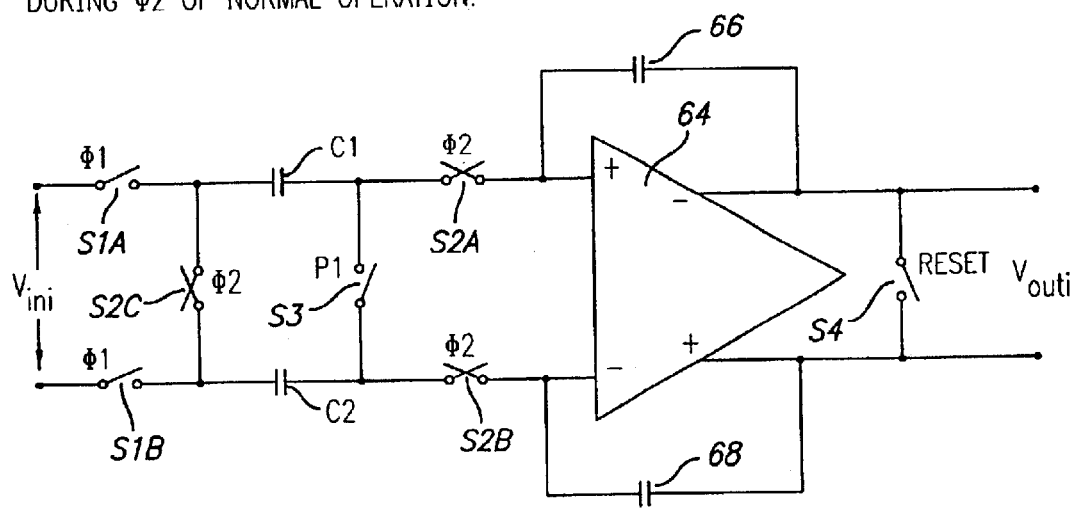
FIG. 4C is a schematic diagram showing the state of the integrator of FIG. 4A during $\phi2$ of normal analog-to-digital conversion operation.
Figure 4D:
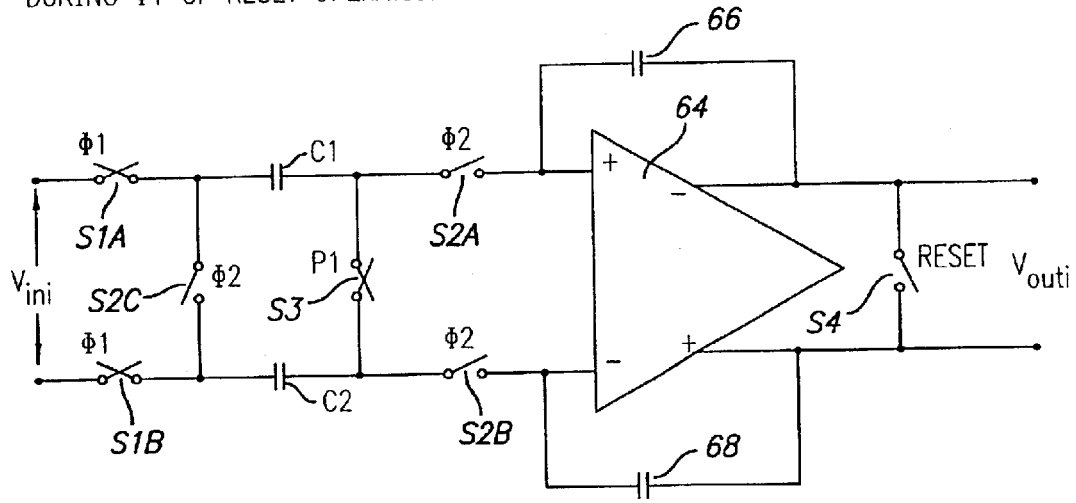
FIG. 4D is a schematic diagram showing the state of the integrator of FIG. 4A during $\phi1$ of a restore operation.
Figure 4E:
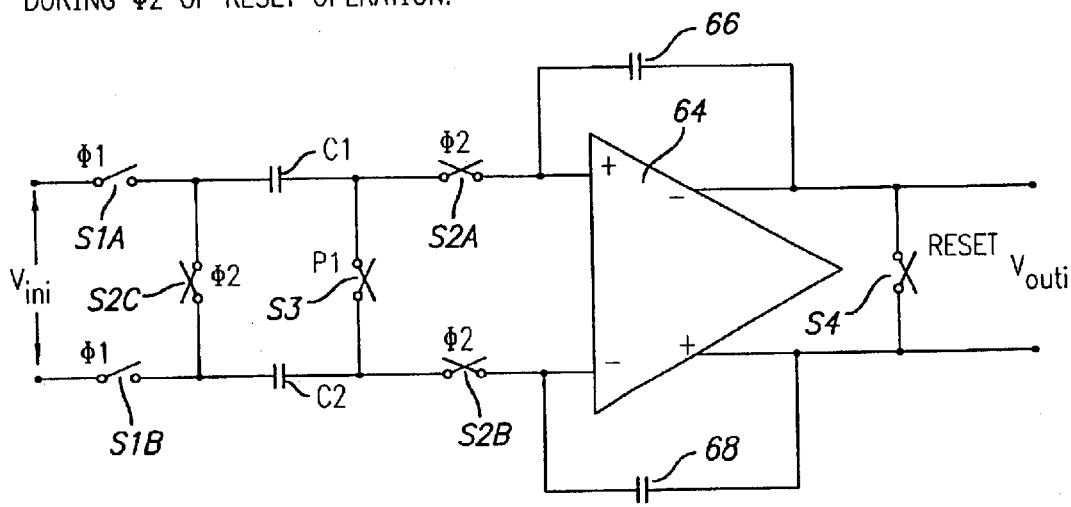
FIG. 4E is a schematic diagram showing the state of the integrator of FIG. 4A during $\phi2$ of a restore operation.

FIG. 4B shows that during φ1 of "normal analog-to-digital conversion operations", sampling switches S1A and S1B and switch S3 are closed, switch S2C, and charge transfer switches S2A and S2B and reset switch S4 are open. FIG. 4C shows that during φ2 of normal analog-to-digital conversion operations, sampling switches S1A and S1B and switch S3 are open, charge transfer switches S2A and S2B and switch S2C are closed, and reset switch S4 is open. FIG. 4D shows that during the φ1 of "restore/reset operations", sampling switches S1A and S1B and switch S3 are closed, and switch S2C, charge transfer switches S2A and S2B, and reset switch S4 are open. FIG. 4E shows that during φ2 of restore/reset operations, sampling switches S1A and S1B are open, and switch S2C, switch S3, charge transfer switches S2A and S2B, and reset switch S4 are closed.

It should be understood that the output of a delta sigma modulator circuit operating within expected parameters typically has a particular expected maximum "run length" of "1"s or "0"s from, for example, 6 to 10 bits in a row. (The maximum run length depends on the particular design of the delta sigma modulator.) For run lengths sufficiently longer than 10 consecutive "1"s or "0"s in a row, it may be determined with relative certainty that the modulator circuit 84 has become "overloaded" and is oscillating, causing the serial modulator output signal to be inaccurate, in which case the delta sigma modulator needs to be restored to a stable condition.

Figure 7:
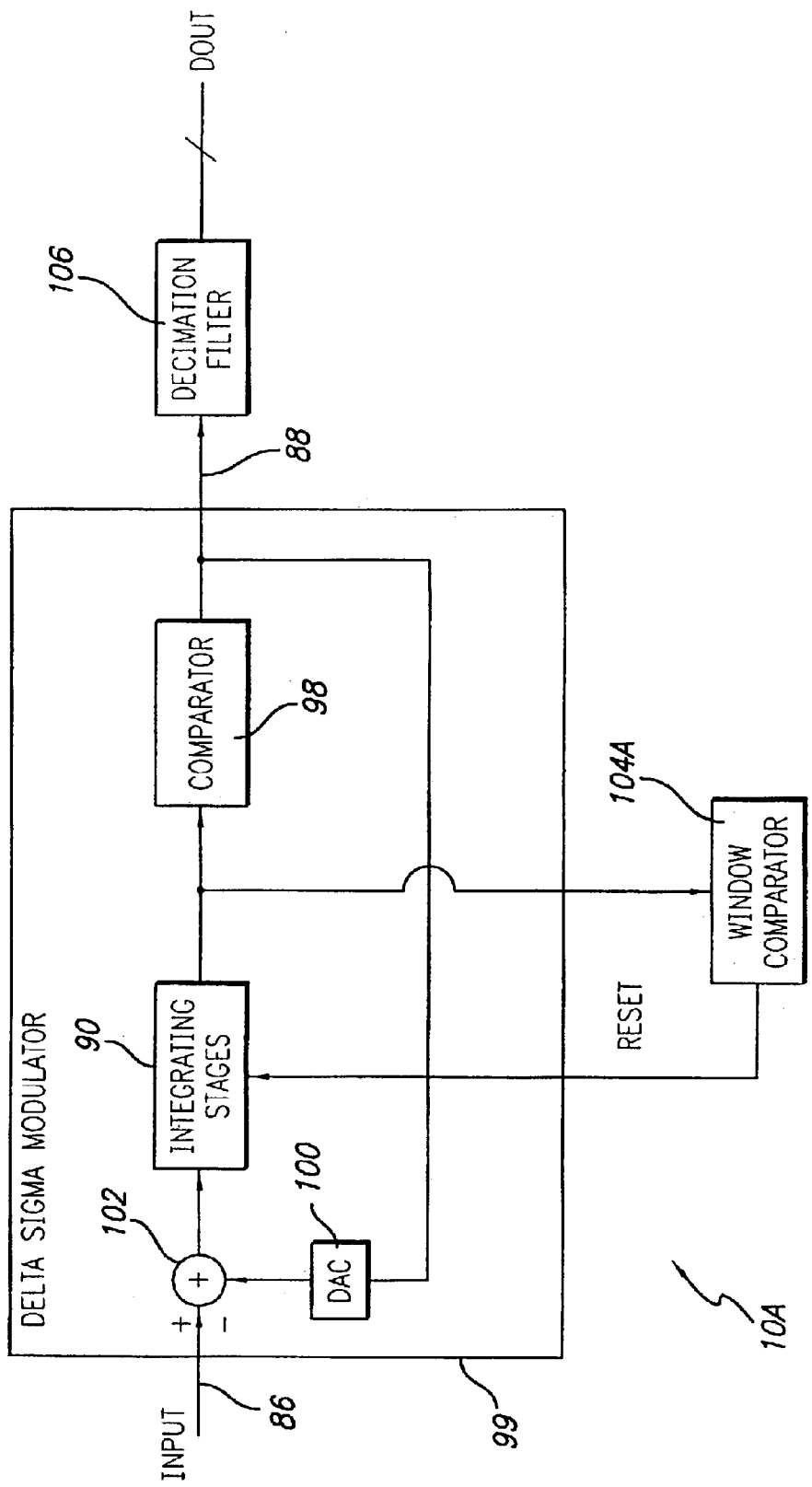
FIG. 7 is a block diagram of an alternate embodiment of the invention.

In the described embodiment, monitor circuit 104 of FIGS. 3 and 7 is configured to count the numbers of consecutive "1"s and "0"s and responsively generate the restore signal RESETA if the number of consecutive "1"s or "0"s ever reaches 24. The information included in restore signal RESETA is used by reset and clock generator circuit 74 to generate the signal RESET that is sent to control the switch S4 in each of the integrator stages 90-1, 2 . . . n. The signal P1 produced by reset and clock generator circuit 74 controls each switch S3 of the various integrators to appropriately restore the various integrator stages 90-1, 2 . . . n to stable conditions. This results in normal operation of each of the integrators 90-1, 2 . . . n wherein if RESETA is at a low or "0" level, then reset switch S4 remains open and switch S3 turns on and off as if controlled by φ1, and also results in reset or restore operation of each integrator wherein if RESETA is at a high or "1" level, then switch S3 remains on and reset switch S4 turns off and on as if controlled by φ2. The number of consecutive "1"s or "0"s at which the restore signal RESETA is generated may, of course, be higher or lower than 24 depending on the requirements for a particular application and the order of the delta sigma modulator.

Figure 1:
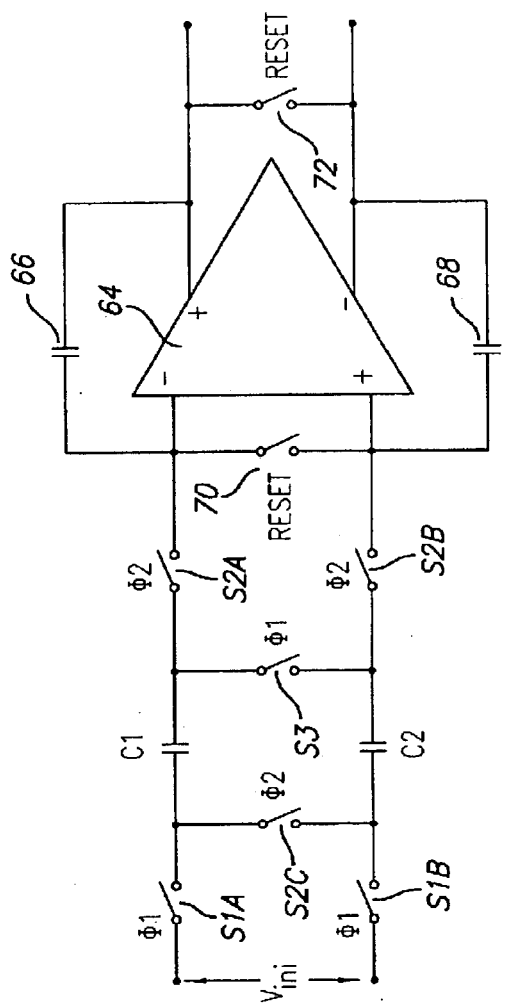
FIG. 1 is a schematic diagram of a prior art integrator used in the delta sigma modulator of FIG. 2.
Figure 2:
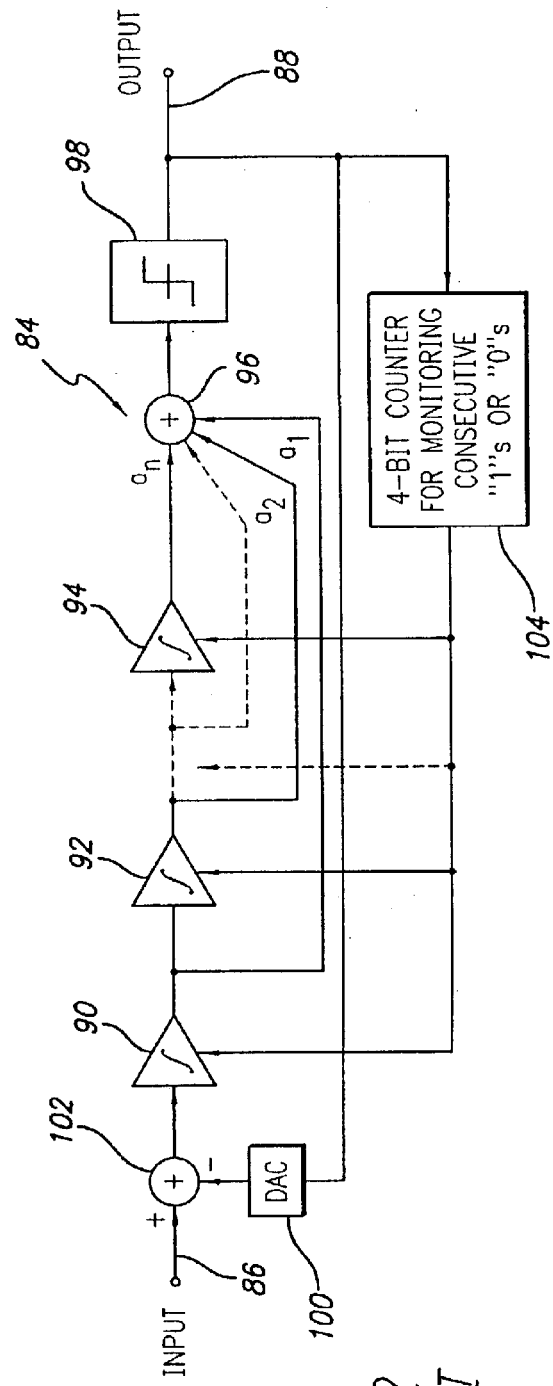
FIG. 2 is a block diagram of a prior art high order delta sigma modulator.

By comparing prior art FIG. 1 to FIG. 4A, it can be seen that reset switch 70 of prior art FIG. 1 does not exist in the present invention. Furthermore, switch S3 and reset switch S4 operate substantially differently in the integrator of the present invention than in the integrator of prior art FIG. 1. Elimination of switch 70 of prior art FIG. 1 from the integrator of FIG. 5A eliminates the undesirable effect of the above-mentioned parasitic capacitances, and also avoids any need to generate an additional reset signal that may be required to ensure that switch 70 and 72 are turned on at exactly the same times and turned off at exactly the same times. Since a precisely balanced condition of the (+) and (−) inputs of operational amplifier 64 is critical to obtaining high conversion accuracy in a higher order delta sigma modulator, the above-mentioned differences from the circuit shown in prior art FIG. 1 herein are especially important to accurate redistribution of the charges on the sampling capacitors C1 and C2 onto the integrating capacitors 66 and 68, respectively, and hence to the overall accuracy of the ADC 10.

Figure 6:
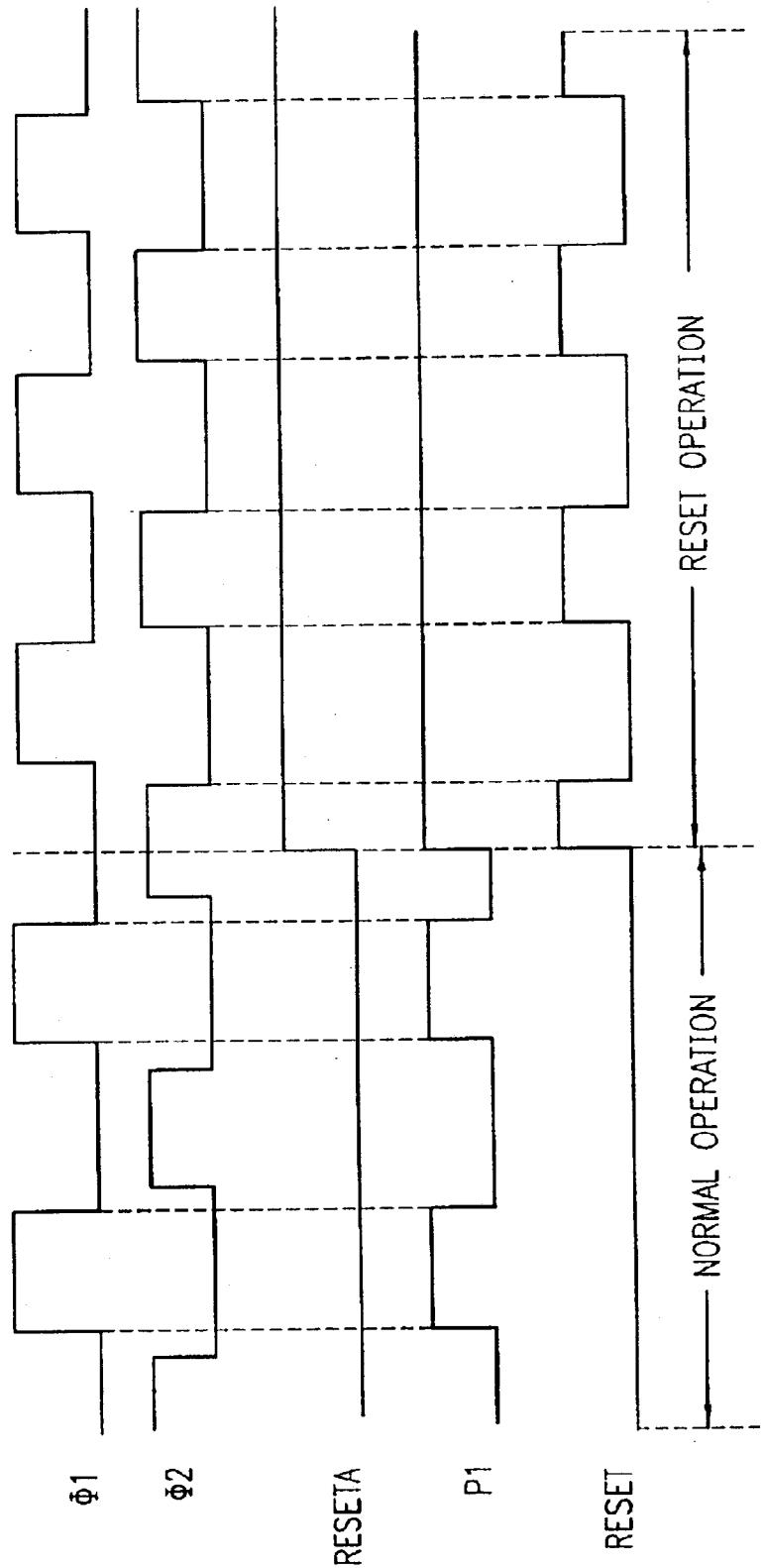
FIG. 6 is a timing diagram that shows the various signals used in FIG. 3.

FIG. 6 shows a timing diagram of φ1, φ2, RESETA, and the P1 and RESET signals produced by clock and reset generator circuit 74 for a both normal analog-to-digital conversion operation and for reset operation.

Monitor circuit 104 can be implemented as a state machine which, upon detecting consecutive "1"s or "0"s on conductor 88, increments from an initial state sequentially toward a final counter state after 24 (or other suitable number) consecutive "1"s or "0"s, respectively, have been counted. A suitable delay is interposed between the initial and final states to ensure that the reset switches of the integrators are turned on long enough to completely reset the entire modulator.

FIG. 7 shows a more generalized implementation of an ADC 10A of the present invention, in which the condition of the delta sigma modulator 99 is monitored by a window comparator 104A to produce a reset signal if the output of the integrating section 90 indicates an unstable condition caused by a (+) out-of-range analog input signal. The input of window comparator 104A is connected to the output of integrator section 90. During circuit design, the range of voltage at (for example) the output of integrating section 90 that is required for stable delta sigma modulator operation can be determined and used to provide the reference voltages, i.e., threshold voltages, needed for window comparator 104A. Thus, the quantizer input, instead of its output, can be monitored to detect an unstable condition and used to generate the modulator reset signal.

The above described integrator circuitry of the present invention avoids the inaccuracies due to the previously described unbalanced parasitic capacitances associated with the integrator circuit of U.S. Pat. No. 6,362,763, and reduces the amount of integrated circuit chip area required by eliminating switch 70 of prior art FIG. 1, and therefore also avoids the need to generate a separate reset signal to control that switch and provide a long conductor for the additional reset signal.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, the operating characteristics of the modulator may be monitored at various other points within the modulator circuit such as at the input, at the output, or at the input or output of any integrator stage. In some cases, it may be practical to reset fewer than all of the integrators of the delta sigma modulator in response to the restore signal RESETA produced by monitor circuit 104.

Various known delta sigma modulator configurations other than the feed-forward configuration shown in FIG. 3 could be used in the present invention. For example, some other configurations do not have a second summer or any of the feed forward conductors. Other known configurations include additional summing nodes at the outputs of the integrators and also include additional DACs. For example, FIG. 8 of above mentioned U.S. Pat. No. 6,362,763 shows yet another delta sigma modulator configuration that could be used in conjunction with the present invention.

What is claimed is:

1. A delta sigma modulator circuit comprising:
   circuitry for summing an input signal with a feedback signal representing signal conditions in a group of integrators to provide an input to a quantizer;
   circuitry for monitoring a signal at the quantizer output to produce a restore signal indicating an instability condition; and
   an integrator including a dual purpose switch that is operated together with first and second sampling switches to accomplish an input signal sampling operation and also is operated together with first and second charge transfer switches and an output reset switch to accomplish resetting of the integrator without being directly connected to the amplifier input.

2. A delta sigma modulator circuit comprising:
   circuitry for summing an input signal with a feedback signal representing signal conditions in a group of integrators to provide an input to a quantizer;
   circuitry for monitoring a signal at the quantizer output to produce a restore signal indicating an instability condition; and
   an integrator including a dual purpose switch that is operated together with first and second sampling switches to accomplish an input signal sampling operation and also is operated together with first and second charge transfer switches and an output reset switch to accomplish resetting integrator without being directly connected to the amplifier input, and
   logic circuitry for operating the dual purpose switch by performing a logical ORing of a first clock signal and the restore signal and for operating the reset switch by performing a logical ANDing of a non-overlapping second clock signal and the restore signal.

3. An analog-to-digital converter comprising:
   (a) a delta sigma modulator including
      i. an input conductor, and a first summing device having a first input coupled to the input conductor,
      ii. a quantizer for producing a modulator output signal on an output of the quantizer,
      iii. a plurality of integrators coupled sequentially between an output of the first summing device and an input of the quantizer, and
      iv. a digital-to-analog converter having an output coupled to a second input of the summing device for providing feedback representative of signal conditions in one or more of the integrators to the second input;
   (b) a monitor circuit including an input responsive to a signal at the output of the quantizer for producing a restore signal in response to occurrence of an instability condition caused by an input overvoltage on the input conductor and represented by the of the signal at the quantizer output;
   (c) a digital filter including an input coupled to the quantizer output and an output coupled to an output bus of the analog-to-digital converter; and
   (d) wherein one or more of the integrators each includes:
      first and second input terminals and first and second output terminals, first and second sampling switches, a first switch, first and second sampling capacitors, a second switch, first and second charge transfer switches, an operational amplifier, first and second integrating capacitors, and a reset switch,
      a first terminal of the first sampling switch being coupled to the first input terminal and a first terminal of the second sampling switch being coupled to the second input terminal,
      a second terminal of the first input sampling switch being coupled to a first terminal of the first switch and a first terminal of the first sampling capacitor, a second terminal of the second input sampling switch being coupled to a second terminal of the first switch and a first terminal of the second sampling capacitor, a second terminal of the first sampling capacitor being coupled to a first terminal of the second switch and a first terminal of the first charge transfer switch, a second terminal of the second sampling capacitor being coupled to a second terminal of the second switch and a first terminal of the second charge transfer switch, a second terminal of the first charge transfer switch being coupled to a (+) input of the operational amplifier and a first terminal of the first integrating capacitor, a second terminal of the second charge transfer switch being coupled to a (−) input of the operational amplifier and a first terminal of the second integrating capacitor, a second terminal of the first integrating capacitor being coupled to a (−) output of the operational amplifier and a first terminal of the reset switch, a second terminal of the second integrating capacitor being coupled to a (+) output of the operational amplifier and a second terminal of the reset switch.

4. The analog-to-digital converter of claim 3 wherein the plurality of integrators are coupled sequentially between an output of the first summing device and a second summing device, an output of each integrator being fed forward to an input of the second summing device, respectively, each integrator having a reset input, the quantizer having an input coupled to an output of the second summing device for producing a modulator output signal on the quantizer output, and wherein the monitor circuit includes an input coupled to the quantizer output, and a restore output for producing a restore signal coupled to a reset input of at least one of the integrators to reset the delta sigma modulator from an unstable condition to a stable condition.

5. The analog-to-digital converter of claim 3 wherein the monitor circuit includes a state machine that performs the functions of monitoring the number of consecutive "1"s and producing a restore signal if the number of consecutive "1"s exceeds a predetermined number.

6. The analog-to-digital converter of claim 5 wherein the state machine performs the functions of monitoring the number of consecutive "0"s and producing a restore signal if the number of consecutive "0"s exceeds a predetermined number.

7. The analog-to-digital converter of claim 6 wherein the state machine produces the reset signal with a duration sufficient to allow sufficient time for the integrators to settle.

8. The analog-to-digital converter of claim 3 wherein the first and second sampling switches are controlled by a first clock signal, the first switch and the first and second charge transfer switches are controlled by a second dock signal, the second switch is controlled by a derived clock signal that is derived from the first and second clock signals and the restore signal, and the reset switch is controlled by a reset signal that is derived from the first and second dock signals and the restore signal.

9. The analog-to-digital converter of claim 8 wherein the derived dock signal and the reset signal are derived by means of a circuit that performs a logical ORing function on the first clock signal and the restore signal to generate the derived dock signal and also performs a logical ANDing function on the second clock signal and the restore signal to produce the reset signal.

10. The analog-to-digital converter of claim 9 wherein the first and second clock signals are non-overlapping clock signals.

11. The analog-to-digital converter of claim 3 wherein the monitor circuit includes a window comparator having an input coupled to the quantizer input.

12. A delta sigma modulator comprising:
(a) an input conductor, and a first summing device having a first input coupled to the input conductor;
(b) a quantizer for producing a modulator output signal on an output of the quantizer;
(c) a plurality of integrators coupled sequentially between an output of the first summing device and an input of the quantizer;
(d) a digital-to-analog converter having an output coupled to a second input of the summing device for providing feedback representative of signal conditions in one or more of the integrators to the second input;
(e) a monitor circuit including an input responsive to a signal at the output of the quantizer for producing a restore signal in response to occurrence of an instability condition caused by an input overvoltage on the input conductor and represented by the signal at the quantizer output;
(f) wherein one or more of the integrators each includes:
first and second input terminals and first and second output terminals, first and second sampling switches, a first switch, first and second sampling capacitors, a second switch, first and second charge transfer switches, an operational amplifier, first and second integrating capacitors, and a reset switch, a first terminal of the first sampling switch being coupled to the first input terminal and a first terminal of the second sampling switch being coupled to the second input terminal, a second terminal of the first input sampling switch being coupled to a first terminal of the first switch and a first terminal of the first sampling capacitor, a second terminal of the second input sampling switch being coupled to a second terminal of the first switch and a first terminal of the second sampling capacitor, a second terminal of the first sampling capacitor being coupled to a first terminal of the second switch and a first terminal of the first charge transfer switch, a second terminal of the second sampling capacitor being coupled to a second terminal of the second switch and a first terminal of the second charge transfer switch, a second terminal of the first charge transfer switch being coupled to a (+) input of the operational amplifier and a first terminal of the first integrating capacitor, a second terminal of the second charge transfer switch being coupled to a (−) input of the operational amplifier and a first terminal of the second integrating capacitor, a second terminal of the first integrating capacitor being coupled to a (−) output of the operational amplifier and a first terminal of the reset switch, a second terminal of the second integrating capacitor being coupled to a (+) output of the operational amplifier and a second terminal of the reset switch.

13. The delta sigma modulator circuit of claim 12 wherein the first and second sampling switches are controlled by a first clock signal, the first switch and the first and second charge transfer switches are controlled by a second clock signal, the second switch is controlled by a derived clock signal that is derived from the first and second clock signals and the restore signal, and the reset switch is controlled by a reset signal that is derived from the first and second clock signals and the restore signal.

14. The analog-to-digital converter of claim 13 wherein the derived clock signal and the reset signal are derived by means of a circuit that performs a logical ORing function on the first clock signal and the restore signal to generate the derived clock signal and also performs a logical ANDing function on the second clock signal and the restore signal to produce the reset signal.

15. A delta sigma modulator circuit comprising:
 (a) means for summing an analog input signal and a feedback signal;
 (b) a plurality of integrators coupled sequentially between an output of the summing means and an input of a quantizer;
 (c) digital-to-analog converting means for producing the feedback signal, the feedback signal being representative of signal conditions in one or more of the integrators;
 (d) monitor circuit means responsive to a signal at an output of the quantizer for producing a restore signal in response to occurrence of an instability condition that is caused by an input overvoltage of the analog input signal and is represented by the signal at the quantizer output; and
 (e) wherein one or more of the integrators each includes:
  first and second input terminals and first and second output terminals, first and second sampling switches, a first switch, first and second sampling capacitors, a second switch, first and second charge transfer switches, an operational amplifier, first and second integrating capacitors, and a reset switch,
  a first terminal of the first sampling switch being coupled to the first input terminal and a first terminal of the second sampling switch being coupled to the second input terminal,
  a second terminal of the first input sampling switch being coupled to a first terminal of the first switch and a first terminal of the first sampling capacitor, a second terminal of the second input sampling switch being coupled to a second terminal of the first switch and a first terminal of the second sampling capacitor,
  a second terminal of the first sampling capacitor being coupled to a first terminal of the second switch and a first terminal of the first charge transfer switch, a second terminal of the second sampling capacitor being coupled to a second terminal of the second switch and a first terminal of the second charge transfer switch,
  a second terminal of the first charge transfer switch being coupled to a (+) input of the operational amplifier and a first terminal of the first integrating capacitor, a second terminal of the second charge transfer switch being coupled to a (−) input of the operational amplifier and a first terminal of the second integrating capacitor,
  a second terminal of the first integrating capacitor being coupled to a (−) output of the operational amplifier and a first terminal of the reset switch, a second terminal of the second integrating capacitor being coupled to a (+) output of the operational amplifier and a second terminal of the reset switch.

16. The delta sigma modulator circuit of claim 15 wherein the first and second sampling switches are controlled by a first clock signal, the first switch and the first and second charge transfer switches are controlled by a second clock signal, the second switch is controlled by a derived clock signal that is derived from the first and second clock signals and the restore signal, and the reset switch is controlled by a reset signal that is derived from the first and second clock signals and the restore signal.

17. The analog-to-digital converter of claim 16 including means for performing a logical ORing function on the first clock signal and the restore signal to generate the derived clock signal, and also including means for performing a logical ANDing function on the second dock signal and the restore signal to produce the reset signal.

18. A method of operating a delta sigma modulator circuit, comprising:
 (a) summing an analog input signal and a feedback signal to provide an input signal to a plurality of integrators coupled sequentially between an output of a summing device and an input of a quantizer;
 (b) producing the feedback signal as an analog feedback signal representative of signal conditions in one or more of the integrators;
 (c) monitoring a signal at an output of the quantizer and producing a restore signal in response to occurrence of an instability condition that is caused by an input overvoltage of the analog input signal and is represented by the signal at the quantizer output, and
 (d) wherein one or more of the integrators each includes:
  first and second input terminals and first and second output terminals, first and second sampling switches, a first switch, first and second sampling capacitors, a second switch, first and second charge transfer switches, an operational amplifier, first and second integrating capacitors, and a reset switch,
  a first terminal of the first sampling switch being coupled to the first input terminal and a first terminal of the second sampling switch being coupled to the second input terminal,
  a second terminal of the first input sampling switch being coupled to a first terminal of the first switch and a first terminal of the first sampling capacitor, a second terminal of the second input sampling switch being coupled to a second terminal of the first switch and a first terminal of the second sampling capacitor,
  a second terminal of the first sampling capacitor being coupled to a first terminal of the second switch and a first terminal of the first charge transfer switch, a second terminal of the second sampling capacitor being coupled to a second terminal of the second switch and a first terminal of the second charge transfer switch,
  a second terminal of the first charge transfer switch being coupled to a (+) input of the operational amplifier and a first terminal of the first integrating capacitor, a second terminal of the second charge transfer switch being coupled to a (−) input of the operational amplifier and a first terminal of the second integrating capacitor,
  a second terminal of the first integrating capacitor being coupled to a (−) output of the operational amplifier and a first terminal of the reset switch, a second terminal of the second integrating capacitor being coupled to a (+) output of the operational amplifier and a second terminal of the reset switch.

19. The method of claim 18 including controlling the first and second sampling switches by a first clock signal, controlling the first switch and the first and second charge transfer switches by a second clock signal, controlling the second switch by a derived clock signal, and producing the derived clock signal in response to the first and second clock signals and the restore signal, controlling the reset switch by a reset signal, and producing the reset signal in response to the first and second clock signals and the restore signal.

20. The method of claim 19 including generating derived clock signal and the reset signal by performing a logical ORing function on the first dock signal and the restore signal and producing the reset signal by performing a logical ANDing function on the second clock signal and the restore signal.

21. The method of claim 20 including turning the second switch and the reset switch on or off precisely in response to a corresponding change in a logical level of the restore signal.

* * * * *